United States Patent [19]
Wu et al.

[11] Patent Number: 5,968,194
[45] Date of Patent: Oct. 19, 1999

[54] METHOD FOR APPLICATION OF WEIGHTED RANDOM PATTERNS TO PARTIAL SCAN DESIGNS

[75] Inventors: David Wu, Beaverton, Oreg.; Praveen Parvathala, Phoenix, Ariz.; Naga Gollakota, Folsom, Calif.

[73] Assignee: Intel Corporation, Santa Clara, Calif.

[21] Appl. No.: 08/831,478

[22] Filed: Mar. 31, 1997

[51] Int. Cl.[6] ........................................ G01R 31/28
[52] U.S. Cl. ................................ 714/726; 714/728
[58] Field of Search ....................... 371/22.31, 22.32, 371/22.33, 22.36, 22.5, 27.2, 27.7, 27.4; 395/183.06, 183.01; 364/488, 489, 578, 717, 717.5; 714/30, 32, 48, 727, 728, 733, 739

[56] References Cited

U.S. PATENT DOCUMENTS

| | | | |
|---|---|---|---|
| 3,614,608 | 10/1971 | Giedd et al. | 324/73 R |
| 3,719,885 | 3/1973 | Carpenter et al. | 324/73 R |
| 4,688,223 | 8/1987 | Motika et al. | 371/27 |
| 4,745,355 | 5/1988 | Eichelberger et al. | 324/73 R |
| 5,043,988 | 8/1991 | Brglez et al. | 371/27 |
| 5,323,400 | 6/1994 | Agarwal et al. | 371/22.3 |
| 5,369,648 | 11/1994 | Nelson | 371/27 |
| 5,485,471 | 1/1996 | Bershteyn | 371/27 |
| 5,596,585 | 1/1997 | Njinda et al. | 371/22.5 |
| 5,612,963 | 3/1997 | Koenemann et al. | 371/27 |
| 5,668,481 | 9/1997 | Sheu et al. | 326/16 |

*Primary Examiner*—Robert W. Beausoliel, Jr.
*Assistant Examiner*—Nadeem Iqbal
*Attorney, Agent, or Firm*—Blakely, Sokoloff, Taylor & Zafman

[57] ABSTRACT

A method and apparatus for using weighted random patterns in a partial scan test. A computer generates deterministic patterns on the partial scan design. Deterministic patterns that have the same number of capture clocks between adjacent scan loads are grouped together into pattern groups. A computer then determines a set of weights corresponding to each of the pattern groups. A tester then uses these weights as a filter to weighted random test patterns and applies these filtered weighted random test patterns along with the appropriate number of capture clock pulses to a device under test.

10 Claims, 6 Drawing Sheets

METHOD FOR APPLICATION OF WEIGHTED RANDOM PATTERNS TO PARTIAL SCAN DESIGNS

BACKGROUND OF THE INVENTION

1. Field of the Invention

This invention relates to testing, and more particularly to the testing of very large scale integrated circuit devices.

2. Description of Related Art

Complex very large scale integrated circuits (VLSI) fabricated on a single semiconductor chip contain thousands of functional circuit elements which are inaccessible for discrete testing. Because of the complexity of the internal interconnections between circuit elements and their combinational interdependencies, testing for device integrity becomes increasingly time consuming as the number of circuit elements increases.

By way of example, if a semiconductor chip were to have fifty input connections, the number of combinations of inputs is $2^{50}$. While one could apply that number of different input patterns, record the output responses, and compare those responses with the responses that ought to result, that is a herculean task and "virtually" impossible for modern production testing.

An alternative testing protocol, is described in U.S. Pat. No. 3,614,608 (hereinafter referred to as "Giedd"). Giedd employs a random number generator to generate the test patterns. This technique considerably reduces the effort of pattern generation needed to test a device. This is true because a random pattern generator, unlike a binary counter, produces a succession of binary words wherein the split between binary zeros and ones approaches a 50% split for a substantial number of successive words. The number of words used in testing is considerably less than the total possible number of different binary counter combinations. During the random pattern test, each input to the device under test (DUT) has a 50% chance of receiving a binary zero or one input.

A second testing protocol is to employ weighted random patterns as inputs to the DUT. This technique involves applying a statistically predetermined greater number of binary ones or binary zeros to the input pins of the DUT. The object is to apply a weighted test pattern that will have a maximum effect upon the inaccessible internal circuit elements.

A further dissertation on weighted random pattern testing can be found in an article by H. D. Schnurmann et al. entitled "The Weighted Random Test-Pattern Generator", IEEE Transactions on Computers, Vol. C-24, No. 7, July 1975 at page 695 et seq. and U.S. Pat. No. 3,719,885 (herienafter referred to as "Carpenter").

Yet another technique used to improve testability is to build into the DUT additional circuit connections for the sole purpose of testing. These circuits should be kept to a minimum, consistent with testing needs, because they reduce the availability of circuits for routine functioning of the device. A device, exemplifying this built-in testability, is described in U.S. Pat. No. 3,783,254.

In order to avoid comparison of every output bit with an expected output bit, "signatures" may be used. The "signatures" are unique representations which correspond to a particular DUT output. Each signature from a DUT is compared with a "good signature". A "good signature" is the signature which is expected to result from a properly functioning DUT. The use of "signatures" in lieu of a comparison of every individual test response with a known good output response is taught by U.S. Pat. No. 3,976,864.

Figure 1:
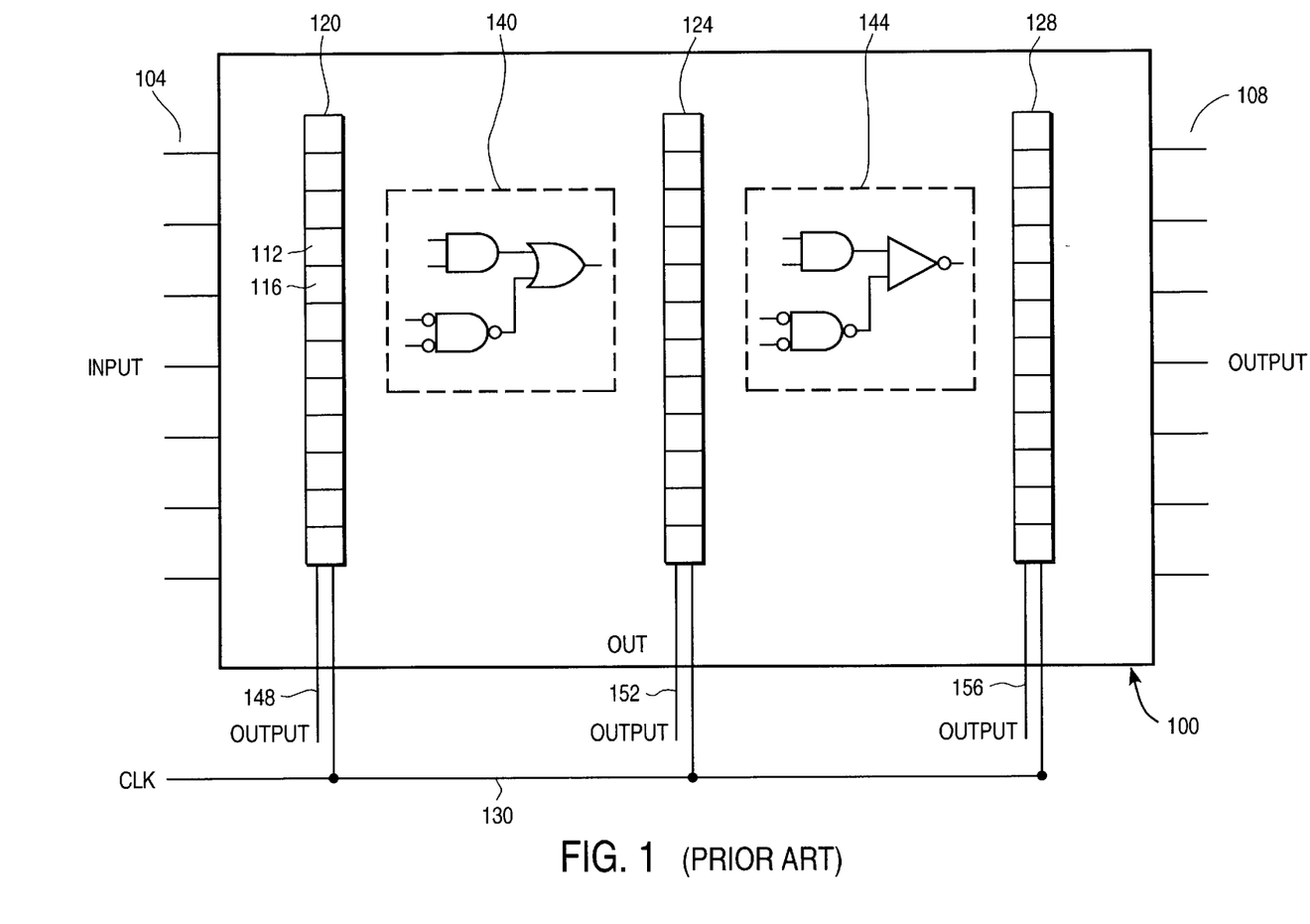
FIG. 1 is a block diagram of the device under test showing sequential elements and combinatorial elements.

FIG. 1 illustrates a schematic view of the DUT 100. DUT 100 may include a number of inputs 104 and outputs 108. Between the input 104 and output 108 are sequential circuit elements e.g. 112, 116 such as flip flops and batches. These elements are coupled together in a chain 120. Other chains 124, 128 of elements may exist throughout DUT 100. In a full scan device, each chain 120, 124, 128 of elements is coupled to an input which can be clocked by a clock line 130 allowing the read-out of each element e.g. 112, 116.

Between chains 120, 124, 128 of elements 112, 116 are combinatoric logic circuits e.g. 140, 144. The logic circuits 140, 144 may include AND gates, OR gates, NOR gates and the like. In a full scan test of the DUT 100, each element 112, 116 is separately accessed and read. In a partial scan test of DUT 100 not all elements are scanned.

Prior art testing methods were suitable for applying weighted random pattern testing to full scan tests of devices. However, such full scan testing of devices is expensive. Full scan testing requires that every element e.g. 112, 116 inside a device be duplicated by a scan equivalent which enables information in the elements 112, 116 to be read out. Thus, a flop is duplicated by a scan flop, a latch is duplicated by a scan latch, such that every element can methodically be accessed by shifting information through a set of scan elements e.g. 120 including scan equivalents. As a result, full scan testing of a device is expensive.

Partial scan testing does not require that every scan element in a device under test be scanned. Instead, information input into a set of scan elements 120 can be propagated through the first set of combinatorial logic circuit elements 140 over one clock cycle and through a second set of combinatorial logic circuit elements 144 during a second clock cycle such that intermediate non-scanned sequential elements 124 can be skipped. The sequential elements 124 are pictured in a chain for convenience, but it is recognized that the sequential elements are not necessarily connected. Deterministic partial scan test patterns are more complicated and thus require significantly more tester memory to store the information. To reduce the tester memory requirements weighted random pattern testing has been used in full scan designs. However, traditional weighted random pattern testing has not been implemented on partial scan designs because weight generation in partial scan designs is orders of magnitude more complex than weight generation in full scan designs.

Thus, it is desirable to have a weighting technique for partial scans to enable weighted random testing of designs to avoid large tester memory requirements.

SUMMARY OF THE INVENTION

The present invention is a method of using weighted random pattern testing in a partial scan device. A computer generates deterministic patterns on a partial scan design. Deterministic patterns that have the same number of capture clocks between adjacent scan loads are grouped together into pattern groups. A computer determines a set of weights corresponding to each of the pattern groups. A tester, on chip or off chip, applies the weighted random test patterns along with the appropriate number of capture clock pulses to a device under test.

BRIEF DESCRIPTION OF THE DRAWINGS

The advantages of the present invention will become more readily apparent to those ordinarily skilled in the art after reviewing the following detailed description and accompanying drawings, wherein.

DETAILED DESCRIPTION OF THE INVENTION

Figure 2:
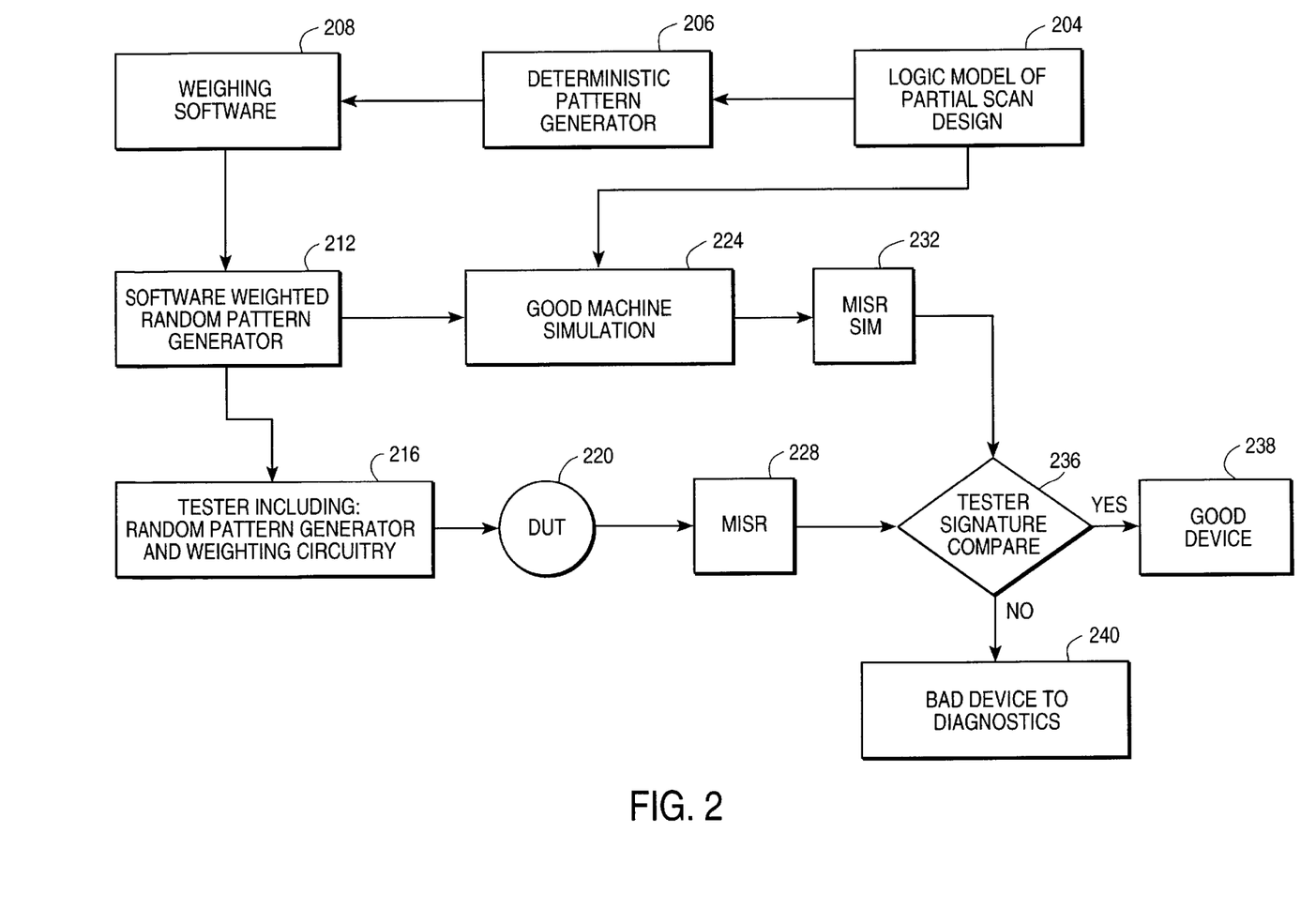
FIG. 2 is a block diagram showing the data path through the various devices in the testing protocol.

FIG. 2 illustrates a broad overall concept of the testing apparatus and method. The testing protocol which is described in this application is generic to a broad class of solid state devices, thus the development of a protocol for each individual device starts with modeling the device under test (DUT), usually with identification of a part number and generation of a corresponding logic model 204. The logic model 204 may be simulated in a computer. Typically, the simulation is based on a schematic diagram or the logic model 204 of each different part numbered device taking into account the interconnections between internal functional elements which connect the input of the DUT to the output of the DUT. Typically, the logic model 204 also includes the nature of each functional element i.e. shift register latch, AND gate, AND invert gate, OR gate, OR invert gate, etc.

A deterministic pattern generator 206, may use this logic model (usually in computer software form) to generate deterministic patterns. Deterministic pattern generating software tools are commercially available from several vendors. The deterministic patterns generated are weighted by a weighting software 208. The weighting software 208 determines the ratio of ones and zeros which should be applied to each input of the DUT and statistically determines appropriate weights for filtering the output of a software random pattern generator 212. The software random pattern generator 212 generates pseudo-random patterns appropriately weighted by the weightings determined in the weighting software 208. The random patterns may be generated in real time ("on the fly") as needed by tester 216 which coordinates input of the random patterns into the DUT 220.

The same weighted random patterns input into DUT 220, are also input into a good machine simulation 224. Thus, the weighted random pattern generator of the tester 216 produces the same weighted random patterns produced by the software 212 for input into good machine simulation 224. Typically, a random number seed and LFSR configuration information is transferred between the software weighted random pattern generator 212 and the tester random pattern generator 216. The good machine simulation 224 is a computer or a processor which simulates the output responses of a good DUT for every set of input stimuli supplied to both the good machine simulation 224 and the DUT 220.

In order to avoid a bit by bit comparison of the DUT 220 output with the good machine simulation 224 output, the output of the DUT 220 is compressed into a signature by a multi-input signature register (MISR) 228. The signature is a derived function of a particular output of the DUT 220. Similarly, the output of the good machine simulation 224 is compressed by a multiple input signature register simulator (MISR SIM) 232. The signature from the MISR SIM 232 is a derived function of the good machine simulation 224 output. The signature from the MISR SIM 232 should match the output from the MISR 228 if the DUT is valid or "good".

Thus, the output of the MISR 228 is compared with the output of the MISR SIM 232 in a tester signature comparator 236 to determine whether the DUT 220 is defective. If the signatures of the DUT matches the signature from the MISR SIM 232 the DUT is deemed valid ("non-defective") or good and may be placed into use 238. If the signature of a defective DUT does not match the signature output from the MISR SIM 232, the defective DUT may either be discarded or subjected to further analysis by a diagnostic routine unit 240. The diagnostic routine unit 240 may be a computer program which varies logic model 204 to simulate defective DUTs. The diagnostic routine unit runs the weighted random input pattern on the various models simulating defective DUTs to try and reproduce an output like that produced by the defective DUT.

Frequently, the problem with a defective DUT is that a logic gate fails to transition and is "stuck" at a particular logic value. The testing protocol outlined in FIG. 2 is designed to detect such a situation. Testing speed is adjusted such that all circuit elements have sufficient time to reach a respective stable states.

Figure 3:
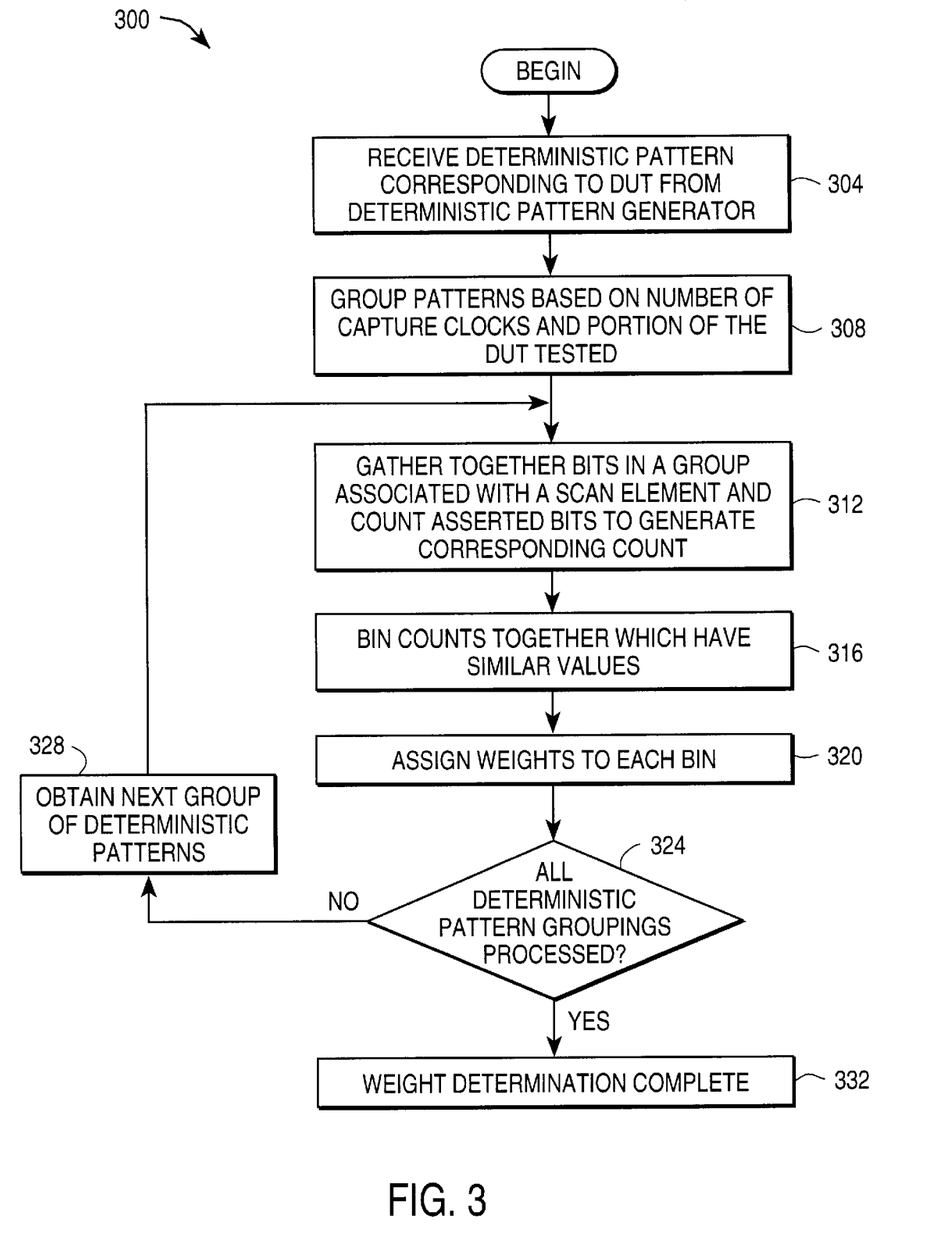
FIG. 3 is a flow diagram of the computer program for calculating weighing.

FIG. 3 illustrates a flow diagram 300 of the steps used by the weighting software 208 to determine weightings for the tester. The weightings are based on the deterministic patterns generated by the logic model 204. In particular, each group of deterministic patterns (a group of deterministic patterns is a collection of deterministic patterns that have the same number of capture clocks) is collected together and weights are computed for each group of deterministic patterns.

In step 304 weighting software receives deterministic patterns for a particular DUT from a deterministic pattern generator 206. Such deterministic pattern generation is accomplished using the logic model 204 and can be done by computer simulation. In step 308, the deterministic patterns are grouped together. The groupings are usually based on the number of capture clocks associated with each pattern. However, if a large number of vectors are generated, the distribution of ones and zeros in each grouping will approach a ratio of 1:1 reducing the effectiveness of the weighting technique. In such cases, the groupings based on capture clocks may be further subdivided. Each subdivision may combine vectors which test similar areas or circuits of the device under test.

Each group of deterministic patterns is handled individually. The bits in a group of deterministic patterns which are associated with a particular scan element of the DUT are gathered together. In step 312, a gathering of bits of a particular logic value is counted, in particular either the number of asserted bits (number of bits with logic value "1") or unasserted bits (number of bits with logic value "0") is determined for each scan element. From this information, a count associated with each gathering of bits is computed.

In step 316, the counts are grouped together or "binned" with other similarly valued counts. Preferably, $2^n$ bins are created where "n" is a positive whole integer. Theoretically, the number of bins is not limited. However, practical considerations limit the number of weights that are to be applied, and thus, the number of bins that will be used. Although the number of bins is not important to the invention, the preferred embodiment of the weighting circuitry is particularly well suited to handle $2^n$ number of bins.

In step 320, weights are assigned to each bin. In one embodiment, the weights assigned are inversely proportional to the number of asserted (or unasserted) bits or counts. For example, if $2^n$ bins are sorted such that bin 1 has the highest count value and bin $2^n$ has the lowest count value where the count value is the number of asserted bits in the deterministic pattern for a particular scan, then bin 1 may be assigned a weight of $$\frac{1}{2^n}$$

and bin $2^n$ may be assigned a weight of 1. The embodiment of the weighting circuit places limits that may include a limitation that not all $2^n$ weights can be produced by the weighting circuitry. In such an embodiment, some bins will be mapped onto or combined with adjacent bins.

After every scan element of a particular grouping of deterministic patterns has been assigned a weight, the weighting program determines whether all the deterministic pattern grouping have been processed in step 324. If not, the next grouping of deterministic patterns is obtained in step 328 and processed in accordance with steps 312–324, inclusive. In step 332, after weights have been assigned to all of the scan elements for each of the deterministic pattern groups, weight determination is complete the weights are ready for computer simulation and to be loaded into the tester 216.

Figure 4:
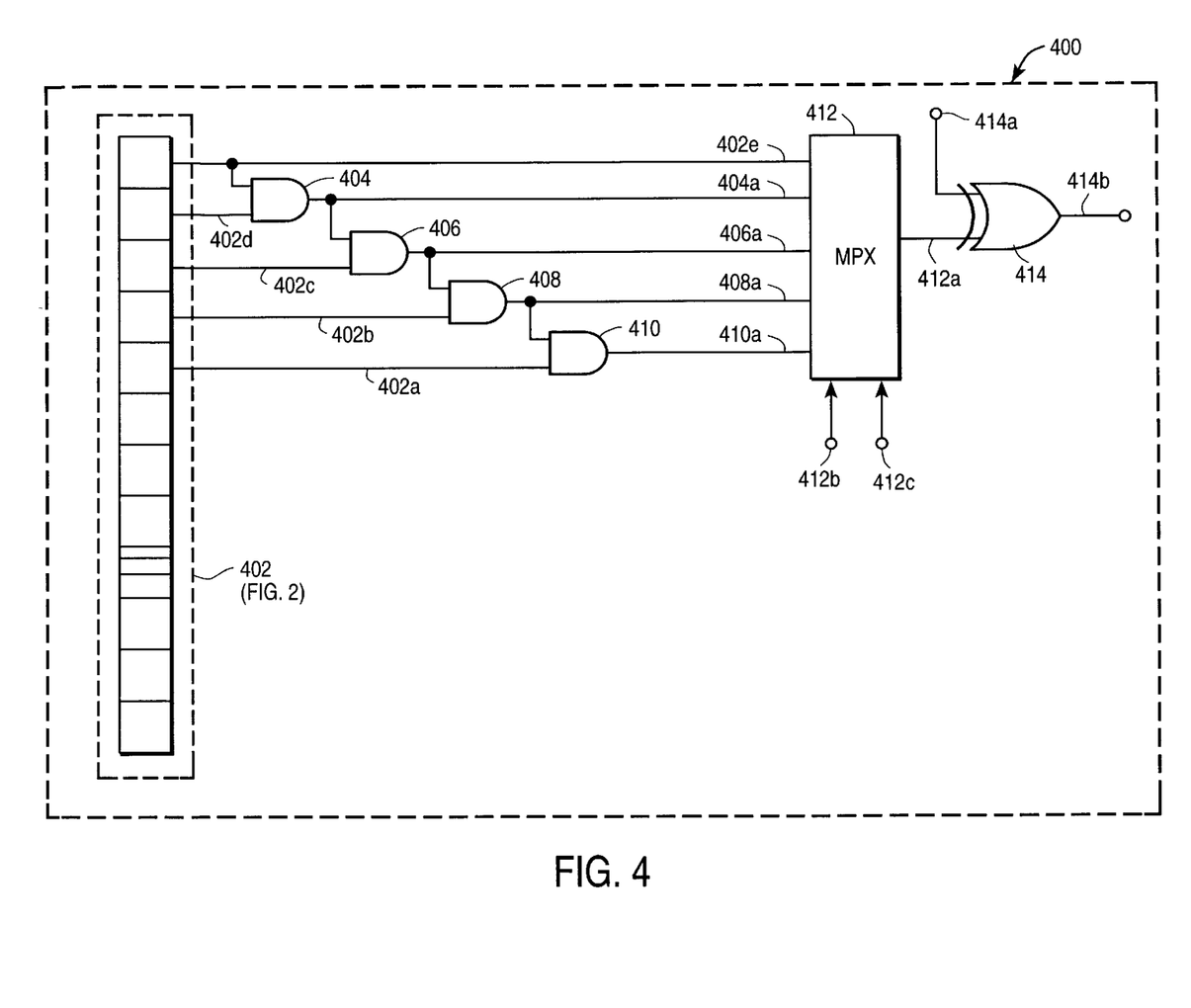
FIG. 4 is a weighting circuit for selecting the weighting of ones and zeros from a random pattern generator.

The tester 216 uses the weights generated from the method described in FIG. 3 to weight pseudo-random numbers. In order to do this, the tester 216 may use a weighting circuit 400 as shown in FIG. 4. In the illustrated embodiment, and each input of the DUT has a corresponding pseudo-random number generator and weighting circuit 400.

The embodiment of the weighting circuit shown in FIG. 4 takes the outputs of the first five stages of a pseudo-random pattern generator which may utilize a bit linear feedback shift register ("LFSR") 402, and connects each stage through cascaded AND gates 404, 406, 408, 410 to a weight selector 412. Each of the lines from the LFSR 402 is configured to produce substantially a 50/50 split of zeros and ones. This is true because of the characteristic of a pseudo-random pattern generator. Thus, the line 402e will produce 50% ones or zeros. However, when line 402e is ANDed with 402d the odds of producing a binary one at the output 404a of AND gate 404 will be only 25%. Conversely, the odds of producing a binary zero at the output 404a will be 75%. By successive halfing of the odds, the odds of producing a binary one or zero on each of the output lines will be as follows:

| LINE | ODDS OF ONE | ODDS OF ZERO | WEIGHTS |
|------|-------------|--------------|---------|
| 402e | 50% | 50% | 1:1 |
| 404a | 25% | 75% | 1:3 |
| 406a | 12.5% | 87.5% | 1:7 |
| 408a | 6.25% | 93.75% | 1:15 |
| 410a | 3.125% | 96.875% | 1:31 |

The weight selector 412 functions to select one of the input lines 402e, 404a, 406a, 408a, or 410a to be gated through to the output line 412a. The weight selecter 412 also controls upon which cycles the chosen output will be gated out.

By way of example, if the line were selected for weighting (weight of one) the weight selector 412 would gate that line through upon every shift cycle of the LFSR 402. If line 404a were selected, the gating would occur every second shift. For line 406a, gating occurs every third shift, 408a every fourth shift, and 410a every fifth shift.

Delaying the shift reduces the interdependencies of successive patterns. Delaying the shifts also results in pattern weights similar to the statistical weightings shown in the foregoing table. Control inputs 412b and 412c provide the selection of the input line and the time that it should be gated through. A final control provided by input 414a selects whether binary zeros or binary ones are to have greater weight. Absent an asserted control signal on 414a, the EXCLUSIVE OR gate 414 will pass the output line 412a unaltered on line 414b. Asserting terminal 414a weights the outputs in favor of a binary one by reversing the sense of columns 2 and 3 of the foregoing table, to provide a selection of weights 1, 3, 7, 15 or 31 for binary ones. The weighting circuit and the random generation pattern generator described may be implemented on the device under test itself.

Figure 5:
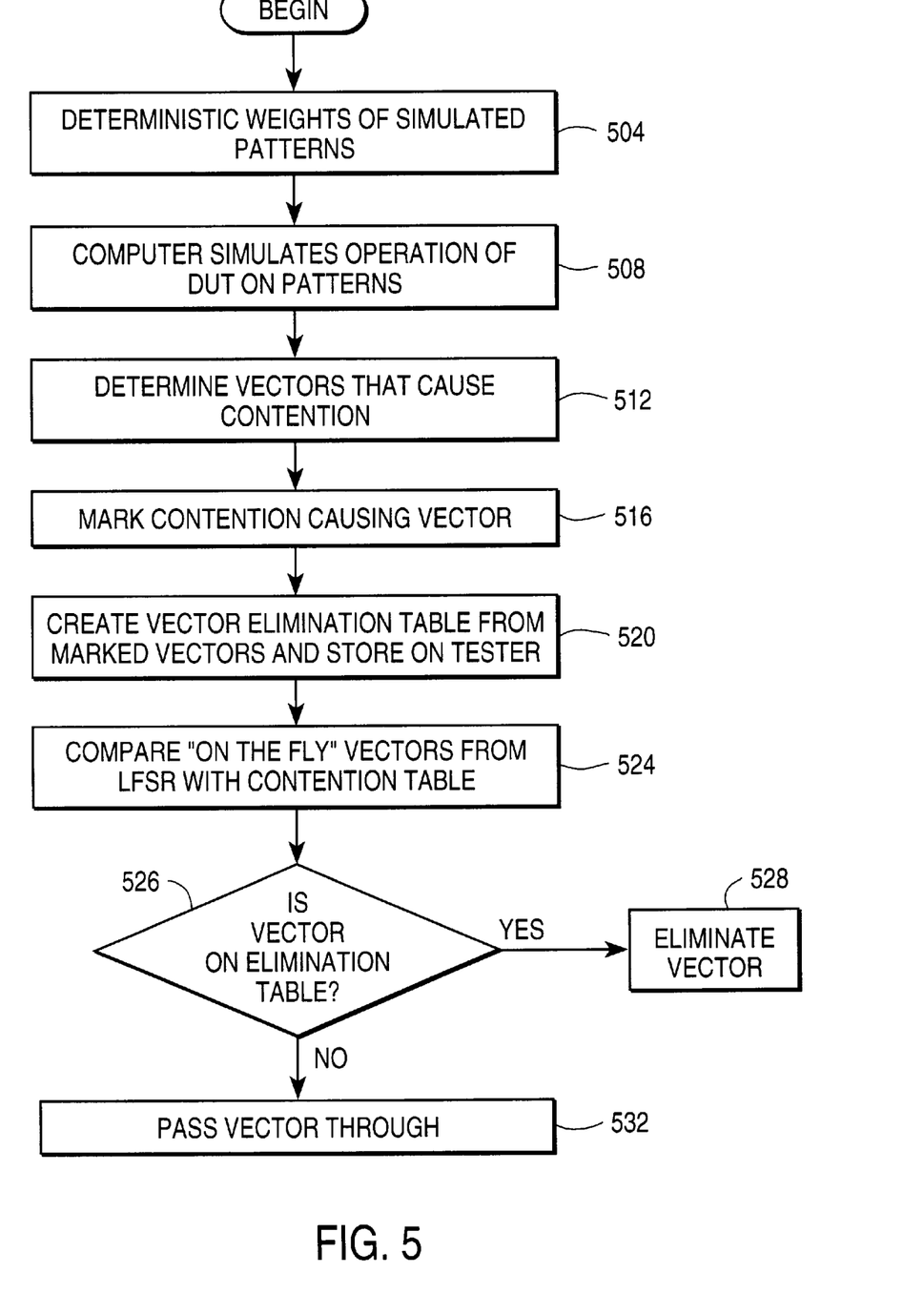
FIG. 5 is a flow diagram of one method of applying a contention control mechanism.

The devices to be tested in the testing protocol itself typically obey strict predetermined rules of binary logic to avoid contention among logic elements. Contention occurs when an impermissible input to the DUT causes circuit elements to simultaneously assign different logic values to a common point in the circuit. This may occur if the device does not follow the strict predetermined rules. FIG. 5 illustrates a flow diagram of one method of contention control.

The contention control method illustrated is particularly well suited to verifying that patterns generated on the fly will not cause contention in the DUT. In step 504, the weights of the simulated patterns are determined as described in the flow diagram of FIG. 3. A computer simulates the operation of the DUT on the various possible patterns in step 508 and determines possible vectors within those patterns that can cause contention in the DUT in step 512. The computer then marks vectors that cause contention for elimination in step 516. From the vectors marked for elimination, a vector elimination table is created and stored on the tester in step 520. The vector elimination table may contain a vector and a corresponding bit indicating whether the vector should be applied or not applied to the DUT. On the fly random patterns generated by the LFSR are compared to determine if a vector needs to be eliminated in step 524. If a vector is to be eliminated, the contention control circuitry may eliminate the vector using a variety of methods including stopping the clock to the scan input of the DUT such that the LFSR shifts the vector out but the shifted vector is not read into the DUT. Thus the vector causing contention is eliminated in step 528. All other vectors pass through in step 532.

Figure 6:
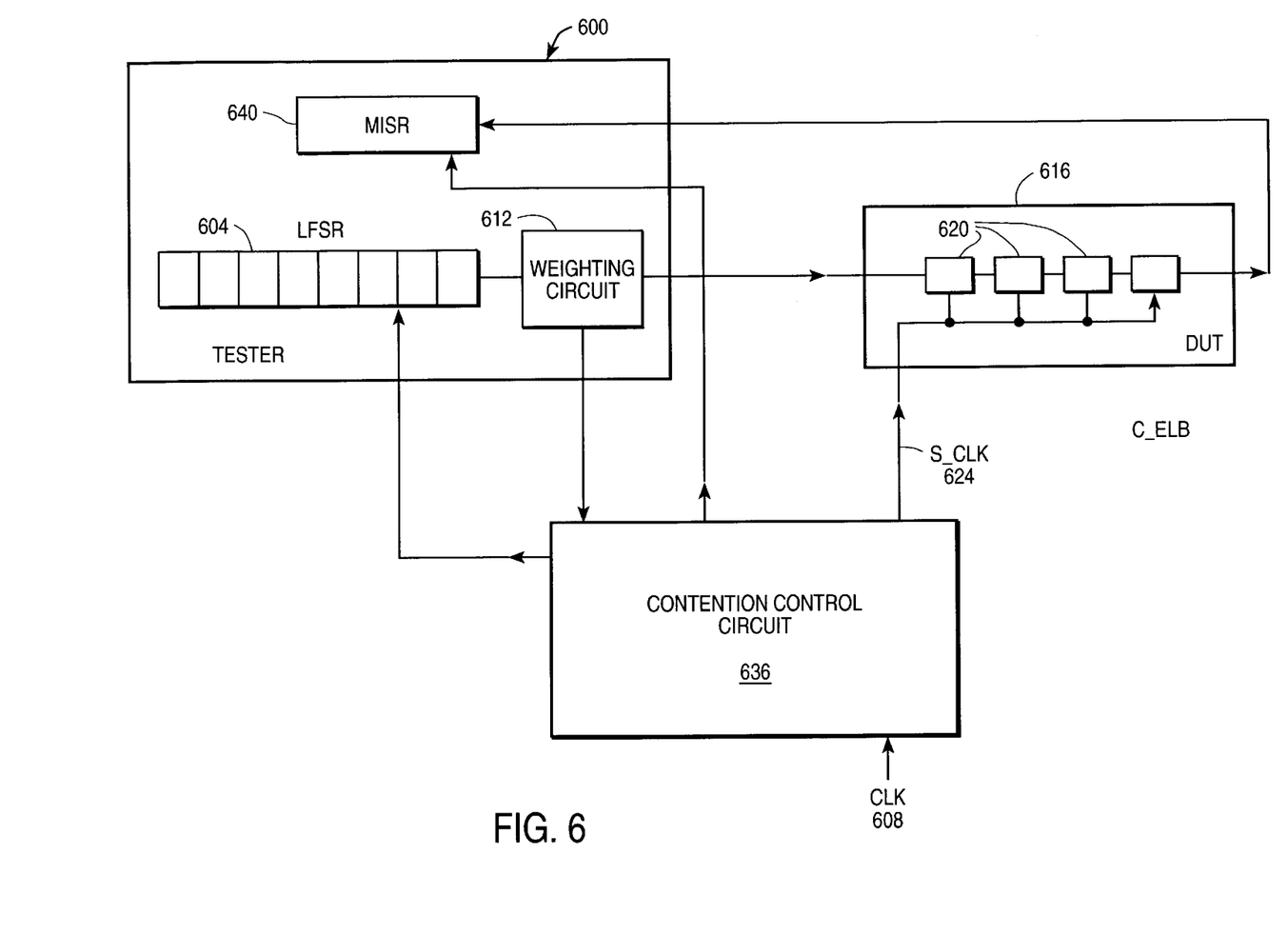
FIG. 6 illustrates one embodiment of a contention control circuit for use with the method described in FIG. 5.

FIG. 6 illustrates one embodiment of a contention control circuit appropriate for use with the method described in FIG. 5. The tester 600 includes a pseudo-random generator LFSR 604 clocked by a LFSR clock 608. During each LFSR clock cycle, the LFSR 604 outputs a vector through weighting circuit 612 to a DUT 616. The scan inputs 620 of the DUT 616 are also clocked using a scan clock 624. A contention control circuit 636 compares the output of the LFSR 604 with a vector elimination table to determine if the vector being input is acceptable. One of skill in the art can implement the contention control circuit in the tester. If the vector to be input will cause contention, the contention control circuit 636 removes the vector. In one embodiment, such removal is achieved by adjusting the clock timing. The output of the DUT 616 is output to a MISR 640 to facilitate generation of subsequent pseudo random number patterns by LFSR 604.

Certain exemplary embodiments have been described and shown in the preceding description and accompanying drawings however, it is to be understood that such embodiments are merely illustrative of and not restrictive on the broad invention, and that this invention is not limited to the specific constructions and arrangements shown and described, since various other modifications may occur to those ordinarily skilled in the art.

What is claimed is:

1. A method for calculating weights for use in weighted random pattern testing of a device under test, said method comprising:

generating a plurality of deterministic patterns, each deterministic pattern having at least one bit targeted to a scan element of the device under test such that each scan element of said device under test corresponds to a plurality of associated bits from the plurality of deterministic patterns;

generating counts by counting the number of identical logic values in said plurality of associated bits for each scan element;

separating the counts into a number of bins and assigning weights to the bins; and assigning weights to each scan element based on the ratio of asserted logic values to unasserted logic values determined from said count.

2. The method of claim 1 further comprising:

weighting pseudo random inputs to said scan elements of the device under test such that a distribution of identical logic values will approximate the distribution of identical logic values in said associated bits for each scan element.

3. The method of claim 1 wherein said separating separates the count into $2^n$ bins where n is positive whole integer.

4. The method of claim 3 wherein each bin is assigned a weight between $½^n$ to one.

5. The method of claim 1 wherein said separating of counts is based on the associated number of clock cycles.

6. The method of claim 1 wherein said scan elements of the device under test are a subset of all latch elements on said device.

7. A method of using weighted random patterns in testing partial scan devices, comprising:

generating deterministic patterns on a partial scan design;

grouping patterns having the same number of capture clocks together into a pattern group; and determining a set of weights corresponding to the pattern group to generate a weighted random test pattern said weighted random patterns obeying logic rules to avoid contentions.

8. The method of claim 7 further comprising:

applying said weighted random test pattern and a corresponding number of capture clock pulses to a device under test.

9. The method of claim 7 wherein said determining of a set of weights further comprises:

counting bits to obtain a number of bits with an identical logic value in each pattern group for each input of said device under test.

10. A method of using weighted random patterns in testing partial scan devices, comprising:

generating deterministic patterns on a partial scan design;

grouping patterns having the same number of capture clocks together into a pattern group;

determining a set of weights corresponding to the pattern group to generate a weighted random test pattern said weighted random patterns obeying logic rules to avoid contentions; and comparing the weighted random test pattern to a table of unacceptable vectors and preventing the unacceptable vectors from being input into the device under test to avoid contention between circuit elements in the device under test.

* * * * *